United States Patent [19]

Hassler et al.

[11] Patent Number: 4,467,272
[45] Date of Patent: Aug. 21, 1984

[54] CIRCUIT FOR MEASURING INDUCTANCE CHANGES

[75] Inventors: Albin Hassler, Schwieberdingen; Eckehart Friz, Stuttgart, both of Fed. Rep. of Germany

[73] Assignee: Robert Bosch GmbH, Stuttgart, Fed. Rep. of Germany

[21] Appl. No.: 368,402

[22] Filed: Apr. 14, 1982

[30] Foreign Application Priority Data

May 6, 1981 [DE] Fed. Rep. of Germany ....... 3117808

[51] Int. Cl.³ ...................... G01R 11/52; G01R 27/26
[52] U.S. Cl. ........................................ 324/59; 324/207
[58] Field of Search ................. 324/59, 207, 208, 345; 73/722, 728

[56] References Cited

U.S. PATENT DOCUMENTS 4,384,251  5/1983  Schelling ........................ 324/59 X

FOREIGN PATENT DOCUMENTS 2259331  6/1974  Fed. Rep. of Germany ........ 324/59
2626959 12/1977  Fed. Rep. of Germany ....... 324/207
2947841  7/1981  Fed. Rep. of Germany ........ 324/59
  21784  2/1979  Japan ..................................... 324/59
2097941 11/1982  United Kingdom .................. 324/59
2098746 11/1982  United Kingdom .................. 324/59

Primary Examiner—Stanley T. Krawczewicz
Attorney, Agent, or Firm—Frishauf, Holtz Goodman & Woodward

[57] ABSTRACT

A Schmitt trigger circuit is caused to oscillate by a time-constant circuit including a reference inductor. The changing inductance of a variable inductor, for example, an inductive transducer for measuring mechanical movements, is switched into the same circuit, and the length of pulses resulting is measured in comparison with the stored value of the pulse length produced by the comparison inductor, which needs to be put in circuit only at longer intervals. With two Schmitt trigger circuits, one controlled by the comparison inductor and maintained in oscillation, while the other is controlled by the variable inductor and is triggered in synchronism with the oscillating Schmitt trigger, a pulse having a length representing the difference between the inductances of the comparison and variable inductors can be simply produced at frequent intervals. Several variable inductors can be continually measured with reference to a single comparison inductor.

9 Claims, 4 Drawing Figures

CIRCUIT FOR MEASURING INDUCTANCE CHANGES

This invention concerns a circuit for measuring inductance changes in a variable inductor. It is of particular use for electrically measuring inductance changes produced by a mechanical movement which causes the inductance of a variable inductor to change.

German patent publication (OS) No. 30 03 892.7, for example, discloses measurement of the change of inductance in an inductor by energizing or discharging the energy of a time constant circuit composed of the inductor and a resistance. In the measurement system there disclosed, a time constant circuit of the resistance-capacitance type (RC) is utilized to provide the reference signal. The initiation of the measurement is externally stimulated by a pulse generator. This arrangement is disadvantageous when electrical or magnetic disturbances are present that may influence the measurement. Furthermore, in this system, slow changes of component properties lead to erroneous results that cannot be compensated. Short-term changes also, for example temperature effects, cause erroneous measurement results.

THE INVENTION

It is an object of the present invention to provide a method of measuring inductance changes in a variable inductor that will not be falsified by short-term or long-term changes in the properties of the components and at the same time be relatively immune to disturbing influences.

Briefly, a comparison inductor of fixed value is used and by means of resistors, time-constant circuits are provided for the variable and for the comparison inductor respectively. The pulses of a Schmitt trigger circuit timed by one of the time-constant circuits is compared with the pulses of the same or another Schmitt trigger circuit timed by the other of the time-constant circuits, preferably with reference to pulse length (pulse duration).

A circuit composed of an inductance and a resistance, through which the same current flows, is known as a time-constant circuit for reasons explained in technical dictionaries.

When the same Schmitt trigger circuit is used successively with two different time-constant circuits, comparison of pulse lengths requires storage of at least one pulse length value, but if two Schmidt trigger circuits are used and one of them is caused to oscillate and to trigger the other, the two pulse lengths can be compared by subtraction in real time. Comparison of the pulse lengths may also be provided in the form of a ratio.

THE DRAWINGS

The invention is further described by way of illustrative examples with reference to the annexed drawings, in which.

DESCRIPTION OF THE ILLUSTRATED EMBODIMENTS

Figure 1:
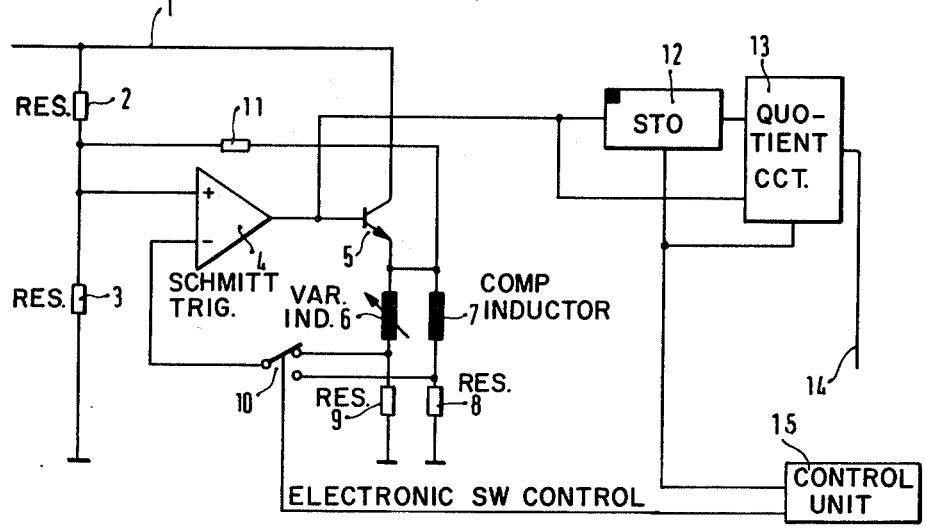
FIG. 1 is a diagram of a circuit of a first embodiment of the invention.

FIG. 1 shows a resistance 2 connected to a supply voltage line 1 and also to a resistance 3 to form a voltage divider connected between the supply line 1 and apparatus ground. The mid-point tap of the voltage divider is connected to the non-inverting input of an operational amplifier 4. The output of the operational amplifier 4 is connected to the base of a transistor 5, which has its collector connected to the voltage supply line 1 and its emitter connected both to the variable inductor 6 and to the comparison inductor 7. The other end of the variable inductor 6 is connected through a resistor 9 to ground, whereas the other end of the reference inductor 7 is connected through a resistance 8 to ground. A changeover switch 10 that is preferably constituted as a semiconductor switch, connects the inverting input of the operational amplifier 4 either to the common connection of the inductance 6 and the resistance 9 or to the common connection of the inductor 7 and the resistance 8. A feedback resistor 11 is connected between the emitter of the transistor 5 and the non-inverting input of the operational amplifier 4, so that hysteresis is produced in the functioning of the operational amplifier when operating as a Schmitt trigger switch.

The output pulses of the operational amplifier 4 are connected from the amplifier output on the one hand to a storage circuit 12 and on the other hand directly to the input of the quotient-forming circuit 13. These circuits are well-known and may be provided in various forms, for example, the storage circuit 12 may store a signal representative of the length of the pulse furnished to it either as a voltage or as a multibit digital signal derived from that voltage or directly from the signal length by timed counting. The quotient-forming circuit 13 utilizes the length of the signal directly furnished to it to provide a representative voltage or digital signal and then executes a division, either by comparing its two inputs in an analog manner or by performing a digital division operation in the conventional electronic way. The quotient-forming circuit 13 has a second input connected to the output of the storage circuit 12.

At the output of the quotient-forming circuit 13, a signal proportional to the inductance change between successive measurements in which the pulse length represents the measured inductance, is available.

A control unit 15, which may be a microprocessor, but could also be a simpler circuit, applies control signals to the loading input of the storage circuit 12 and to the quotient-forming circuit 13, as well as to the changeover switch 10.

Figure 2:
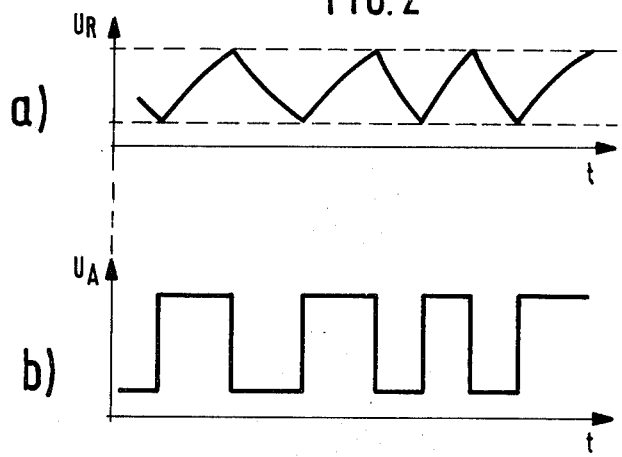
FIG. 2 is a graph of the course of voltages with time in the circuit of FIG. 1.

The manner of operation of the above-described circuit is best explained with reference to FIG. 2. The transistor 5 operates in an emitter-follower circuit to apply the output voltage of the operational amplifier 4 at lower impedance to the components connected to its emitter. In consequence, the transistor 5 applies a series of voltage jumps of constant magnitude to the two inductors 6 and 7. As the result of the advocation of these voltage jumps, a current is produced through the inductors 6 and 7, the value of which can be taken off as the voltage $U_R$ at the respective junctions of these inductors with the resistances 9 and 8. By use of the switch 10, the voltage drop across one of the resistances 9 and 8 can be selectively taken off and applied to the input of the operational amplifier 4 which operates as a Schmitt trigger circuit. The switch 10 is preferably constituted as an electronic switch, in particular as an MOS switch. By the provision of this switch in a feedback circuit branch, only a small current flows through the switch 10 on account of the high input resistance of the operational amplifier 4, so that the currents flowing through the switch are easily processed and do not appreciably distort the measurement. When the voltage $U_R$ reaches the upper comparison voltage of the Schmitt trigger circuit, the output of the operational amplifier, and with it the voltage at the emitter of the transistor 5, suddenly drops and may be regarded as going from a logic value 1 to a logic value 0. At the same time, by means of the resistor 11, the Schmitt trigger input threshold is brought ot the lower comparison voltage threshold. The transistor 5 operating as a voltage follower operates continuously in a more or less conducting condition. The current for energizing and de-energizing the inductors 6 and 7 flows through the transistor 5, so that temperature influences on the transistor 5 do not affect the precision of the circuit. At the output of the Schmitt trigger, a voltage $U_A$ corresponding to that shown of the curve (b) of FIG. 2 is available. The longer pulses represent the pulse train produceable when the comparison inductor 7 is switched to the inverting input of the operational amplifier, whereas the shorter pulses occur when the variable inductor 6 is connected in. The pulse sequence now is provided on the one hand to the storage unit 12 and on the other hand to the quotient-forming circuit 13. If the switch 10 is operated so that the comparison inductor 7 determines the oscillation frequency of the circuit, the storage unit 12 is given a load command at the same time by control of the circuit 15, so that this pulse is stored in the storage unit 12. As soon as the variable inductor 6 is again switched in, the quotient-forming circuit 13 is regularly commanded by the control unit 15 to produce the quotients of the stored value from the comparison inductor 7 and the variable value from the variable inductance 16, so that at the output of the quotient circuit a signal is available which is proportional to the changing inductance of the variable inductor. By appropriate processing, the output signal could of course be made to represent the change in inductance from one measurement to the next. If switching back and forth between the variable inductance 6 and the comparison inductance 7 is produced in regular alternation, it is possible to utilize a delay circuit instead of the storage unit 12. It is sufficient, however, if the value of the comparison inductance is obtained only at longer intervals, so that more time is made available for the actual measurement operation. This method of measurement is of importance mainly when very rapid inductance changes in the variable inductor 6 are to be observed. In contrast to the variable inductance 6, the inductance of the comparison inductor 7 changes only slowly, for example under the effect of temperature and aging, and it consequently does not need to be measured very often.

The measurement can be operated still more simply and quickly if instead of the quotient-forming circuit 13, a difference-forming circuit is provided. The circuit can be extended to utilize any desired number of variable inductors without great expense, in which case the several variable inductors can be interrogated one after the other. In that manner, several measurements are possible with one and the same circuit, so that a particular simple elaboration of the circuit of FIG. 1 results. The inductors 6 and 7 are preferably of similar construction and located near to each other, so that the full benefit of compensation effects can be obtained.

Figure 3:
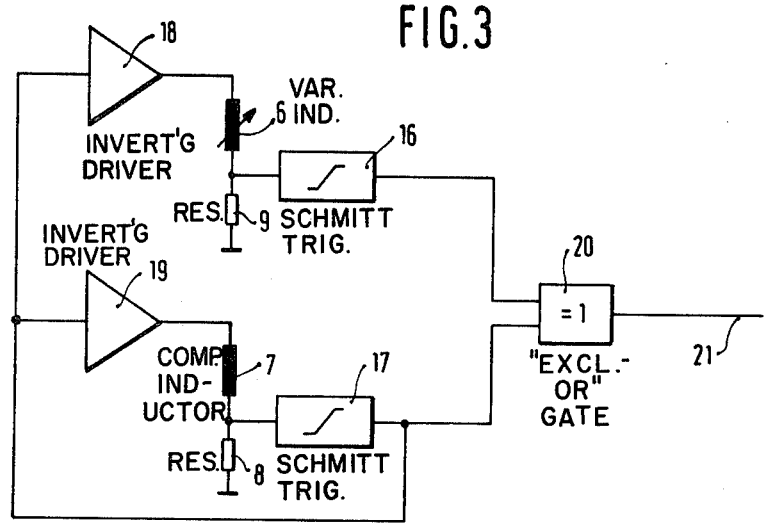
FIG. 3 is a circuit diagram of a second embodiment of the invention.

The circuit shown in FIG. 3 likewise uses the variable inductor 6 which forms a time-constant circuit with the resistance 9. A conductor leads from the common connection of the inductor 6 and the resistance 9 to a Schmitt trigger circuit 16 the output of which is connected to one input of an exclusive-OR gate 20. In a similar manner, the comparison inductor 7 forms a time-constant circuit with the resistance 8, at the mid-tap of which circuit the input of a Schmitt trigger circuit 17 is connected that has its output connected to the second input of the exclusive-OR gate. The output of the Schmitt trigger circuit 17 is also connected to the inputs of the inverting driver stages 18 and 19. The output of the driver stage 18 is connected to the variable inductor 6 and the output of the drive stage 19 with the comparison inductor 7 for applying voltage steps to them.

Figure 4:
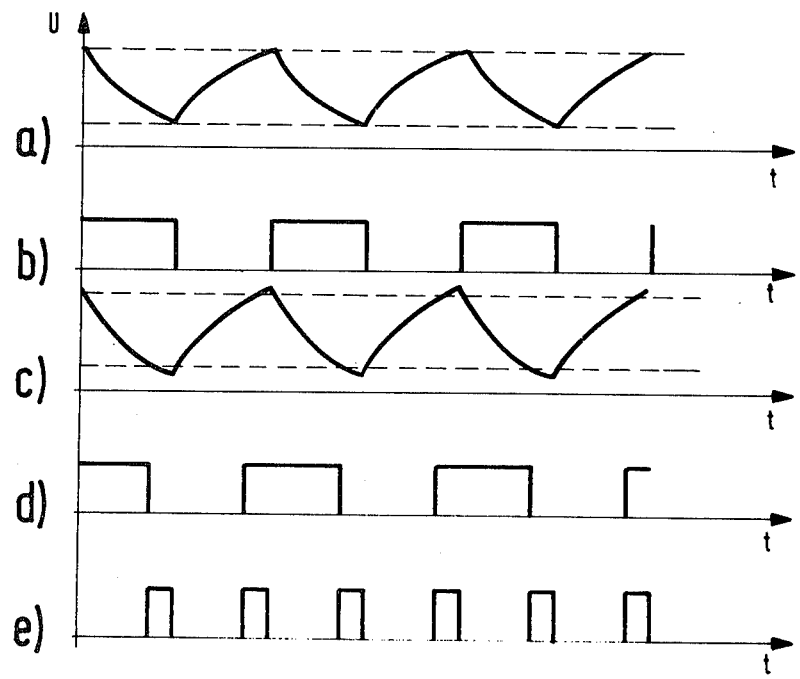
FIG. 4 is a graph showing the time course of voltages in the circuit of FIG. 3.

By the connection of the output of the Schmitt trigger 17 with the input of the inverting driver 19, this group of circuits operates as an oscillator, of which the frequency is determined by the value of the inductance 7 and the value of the resistance 8, as well as by the hysteresis of the Schmitt trigger. Since there is no equivalent connection between the output of the Schmitt trigger 16 and the input of the inverting driver 18, this circuit arrangement cannot operate as an oscillator. By the connection together of the inputs of the driver 18 and 19, however, the effect is produced that the circuit portion containing the variable inductor 6 and the resistance 9 is triggered in step with the oscillating circuit. What happens at the inductor 7 is similar to the case of the previously described circuit of FIG. 1, so that a signal corresponding to that of curve (a) of FIG. 4 is obtained at the resistance 8, and a signal corresponding to curve (b) is obtained at the output of the Schmitt trigger 17. The pulse sequence is accordingly constant. Disturbing influences in the oscillator circuit now operate simultaneously on both stages, since both inductors are switched simultaneously. If now the variable inductor has a lower inductance than the comparison inductor 7, the input voltage at the Schmitt trigger 16 reaches a fixed threshold value before this value is reached at the input of the Schmitt trigger 17 (see curve (c) of FIG. 4), so that the Schmitt trigger 16 switches earlier, as shown in curve (d) of FIG. 4. The time from the switching over of the Schmitt trigger 16 until the switching over of the Schmitt trigger 17 is thus proportional to the difference between the inductances. The difference pulse corresponding to that time interval is produced by the exclusive-OR gate 20, and is shown in line (e) of FIG. 4. This pulse is made available at the output 21. Instead of the exclusive-OR gate 20, for the simplest case, an AND-gate can be used for indicating the phase shift of the Schmitt trigger output voltage.

The pulse obtained from either of the circuits herein described can be further processed by analog or digital methods in a wide variety of ways. For example, counters can be turned on or off with the pulse, or the pulse can be converted into an analog signal. The circuit of FIG. 3, like that of FIG. 1, can be extended in many ways, for example by adding additional variable inductors and Schmitt trigger circuits related thereto corresponding to the inductor 6 and the circuit 16, for use in parallel with the oscillating circuit in which the comparison inductor 7 is connected. With additional comparators, the individual inductance changes can be indicated.

If high precision is desired, it is also possible to measure a number of difference pulses and to form an average value from them. High resolution can be obtained by such average formation. Furthermore, the data obtained can then be slowly transmitted in serial fashion.

Although the invention has been described with reference to particular illustrative embodiment, it will be understood that variations and modifications are possible within the inventive concept.

We claim:

1. Apparatus for measuring inductance changes in a variable inductor (6) comprising in combination therewith:
   a comparison inductor (7) of substantially fixed inductance value;
   a first resistance (9) in series with said variable inductor for providing therewith a time-constant circuit branch;
   a second resistance (8) in series with said comparison inductor for providing therewith a second time-constant circuit branch;
   a Schmitt trigger circuit connected for producing oscillation between its switching threshold stages timed selectively by said first or said second time-constant circuit branch in accordance with the setting of a selector switch (10), and
   means for comparing pulses of said oscillations timed by said first time-constant circuit branch with pulses of said oscillations timed by said second time-constant circuit branch.

2. Apparatus for measuring inductance of a variable inductor (6) comprising, in combination therewith:
   a comparison inductor (7) of substantially fixed inductance value;
   a first resistance (9) in series with said variable inductor for providing therewith a first time-constant circuit branch;
   a second resistance (8) in series with said comparison inductor for providing therewith a second time-constant circuit branch;
   a first Schmitt trigger circuit (17) connected for producing square wave oscillations timed by said second time-constant circuit branch;
   a second Schmitt trigger circuit (16) connected for being triggered at one flank of a pulse produced by said first Schmitt trigger circuit acting through said first time-constant circuit branch, and
   means for comparing the pulses produced by said first Schmitt trigger circuit with the pulses produced by said second Schmitt trigger switch (16).

3. Apparatus as defined in claim 1, in which means are provided for external control of the operation of said selector switch (10).

4. Apparatus as defined in claim 1, in which said selector switch is an electronically controlled switch (10) interposed in a feedback path provided for said Schmitt trigger circuit (4) for selecting whether said feedback path will pass through said variable inductor or said comparison inductor.

5. Apparatus as defined in claim 1, 3 or 4 in which said pulse comparing means comprises storage means for storing at least the length of a pulse timed by one of said time-constant circuits.

6. Apparatus as defined in claim 5, in which said pulse comparing means is constituted as means for subtracting the length of a pulse timed by one of said time-constant branch circuits from the length of a pulse timed by the other of said time-constant branch circuits.

7. Apparatus as defined in claim 2, in which said pulse comparing means is constituted so as to measure at least the length of pulses produced by one of said Schmitt trigger circuit.

8. Apparatus as defined in claim 2, in which said pulse comparing means is constituted so as to compare the lengths of pulses respectively produced by said first and second Schmitt trigger circuits.

9. Apparatus as defined in claim 2, in which said pulse comparing means is constituted so as to subtract the length of a pulse produced by one of said Schmitt trigger circuits from the length of a longer pulse produced by the other of said Schmitt trigger circuits.

* * * * *